United States Patent [19]
Stutz

[11] 3,763,384
[45] Oct. 2, 1973

[54] BISTABLE AND CONTROLLABLE FLIP-FLOP-CIRCUIT ARRANGEMENT

[75] Inventor: Theo Stutz, Basserdorf, Switzerland

[73] Assignee: Contraves AG, Zurich, Switzerland

[22] Filed: Nov. 17, 1971

[21] Appl. No.: 199,710

Related U.S. Application Data

[63] Continuation-in-part of Ser. No. 3,896, Jan. 19, 1970, abandoned.

[30] Foreign Application Priority Data

Jan. 21, 1969 Switzerland .......................... 819/69

[52] U.S. Cl. .................. 307/291, 307/278, 307/282, 328/196, 328/206

[51] Int. Cl. .......................................... H03k 3/286

[58] Field of Search .................... 307/276, 278, 282, 307/291, 292; 328/196, 206

[56] References Cited

UNITED STATES PATENTS

| | | | |
|---|---|---|---|
| 3,160,804 | 12/1964 | Quittner | 307/282 X |
| 2,802,941 | 8/1957 | McConnell | 328/206 |
| 3,140,434 | 7/1964 | Hetzel | 328/206 X |
| 3,334,245 | 8/1967 | Cox et al. | 307/282 |

*Primary Examiner*—John Zazworsky
*Attorney*—Werner W. Kleeman

[57] ABSTRACT

A bistable and stability controllable flip-flop circuit arrangement comprising two amplifiers each having an output and an input. Means define respective direct-current coupling paths for mutually coupling the respective output of each amplifier with the input of the other amplifier in such a manner that in each of both operating conditions one of both amplifiers assumes an active amplifying state and the other of both amplifiers is driven into an inactive non-amplifying state. There is also provided means defining a respective alternating current-feedback path incorporating phase-rotating impedances arranged between both amplifiers between their own respective input and output. A movable control body changes the value of at least one of the phase-rotating impedances such that selectively for the one or the other of both amplifiers a positive alternating current-feedback condition is fulfilled between its output and its input which renders unstable the amplifying state in which the relevant amplifier is functioning and via the direct current-coupling paths common to both amplifiers switches such amplifier into its other operating state.

22 Claims, 7 Drawing Figures

BISTABLE AND CONTROLLABLE FLIP-FLOP-CIRCUIT ARRANGEMENT

CROSS-REFERENCE TO RELATED APPLICATION

The present application is a continuation-in-part application of my commonly assigned co-pending United States application Ser. No. 3,896, filed Jan. 19, 1970 now abandoned and entitled: "BISTABLE FLIP-FLOP CIRCUIT ARRANGEMENT."

BACKGROUND OF THE INVENTION

The present invention broadly relates to electronic circuit arrangements, and, more specifically, deals with a new and improved stability controlled bistable flip-flop circuit arrangement which is of the type conventionally embodying two amplifiers, preferably transistor amplifiers, wherein the respective output of one amplifier is connected with the input of the other amplifier through the agency of direct-current coupling circuits which are identical to one another and mutually coupled with one another such that in each of both operating conditions one of both amplifiers is driven into its active, differentially amplifying operating state and the other into its inactive, non-amplifying operating state, i.e., is in its no-load or cut-off state or preferably in its saturation state, and vice versa.

Heretofore known flip-flop circuit configurations of this general type can be controlled so as to assume a given one of two possible operating conditions by galvanically delivering a suitably polarized direct-current switching pulse to one or the other amplifier input. With the aid of an output circuit of known construction connected with one or both amplifiers, it is possible to generate a binary output signal with two possible states, O = No, (voltage or current smaller or the same as a lower threshold value), and L = Yes, (voltage or current larger or the same as an upper threshold value). The momentary condition or state of the binary signal O or L indicating the momentary operating state (active amplifying or inactive non-amplifying state) of one of both flip-flop amplifiers and therefore the complete flip-flop circuit configuration. Such binary signals are suitable for storage at counting stages or for binary control of other devices.

Oftentimes, for purposes of influencing a current circuit, it is desired to generate a bivalent, i.e., binary output signal as a function of the mechanical movement of a control element or body. During continuous movement of the control body throughout a boundary range, at which there is possible both conditions or states of the output signal, after passing through such boundary range, a jump-like change of the value of the output signal from the prior first signal value into the other possible second signal value should be brought about. During subsequent movement of the control body in the opposite direction, the second value of the output signal should be maintained until the control body has again passed through the previously mentioned boundary range. At the other end of the boundary range, the control body should again bring about a jump-like change or snap action of the output signal from the second signal value to the first signal value. This hysteresis characteristic of the actuation function is of decisive importance for the reliability of such mechanically actuated transmitters for bivalent output signals.

The simplest known construction which satisfies these operating conditions is still a mechanically actuated switch arranged in a current circuit which under the influence of the force of a spring carries out a jump-like switching operation. There are a great number of constructions of such jump type or snap-action switches known to the art. Nonetheless, the contact locations of mechanically actuated contact switches are still basically always subjected to contamination and corrosion effects, and some physical constructions, relay contacts for instance, tend to chatter during their snap-action switching function into their new stable position, causing possible operational disturbances.

Different apparatus constructions are already known to the art for the purpose of producing bivalent output signals at each end of a boundary range which alternately jump from the previous one signal value into the other possible signal value as a function of the mechanical movement of a control body and without utilizing mechanically actuated contacts. Therefore, there has, for instance, already been proposed a controllable bistable flip-flop circuit arrangement, for instance of the general character discussed above, which is operatively coupled with a series connected transmitter for a direct-current control signal. This transmitter is constructed such that one such direct-current control signal serves to switch the flip-flop circuit arrangement, without using movable switching contacts, as a function of the momentary position of a movable control body. For instance, photoelectric cells in conjunction with a mechanically movable light stop or diaphragm, magnetic flux or field-dependent conductors in conjunction with movable permanent magnets and mechanically variable impedances, for instance capacitors or inductors, in an external alternating-current circuit, generally in conjunction with rectifiers and/or signal amplifiers, serve to deliver such type DC-control signals for switching a subsequently connected flip-flop circuit arrangement. Nonetheless, the above-considered replacement of the mechanically actuated jump or snap-action switches by a flip-flop circuit arrangement with a series connected control signal transmitter, however, requires a considerably greater technological expenditure and therefore is not satisfactory.

SUMMARY OF THE INVENTION

Hence, it is a primary object of the present invention to provide a new and improved construction of bistable and controllable flip-flop circuit arrangement of the character described, which, by carrying out relatively few complicated changes, can be modified to provide a complete replacement for a mechanically actuated jump type switch with the previously discussed hysteresis characteristics of its actuation function.

Another significant object of the present invention is to provide a novel construction of flip-flop circuit arrangement enabling reliable mechanical control of the predetermined operational conditions of such flip-flop circuit arrangement, and specifically controlling such that it can be switched from a prior operating state to another operating state or condition, preferably merely through the contactless approach or withdrawal of a movable control body.

In keeping with the aforementioned objectives, it is a further object of this invention to provide a flip-flop circuit arrangement possessing the operating characteristics explained above and which importantly can be fabricated as an integrated circuit suitable for mass production techniques.

Still a further significant object of the present invention relates to a novel stability controlled bistable flip-flop circuit configuration wherein it is possible to trigger the desired switching operation for the circuit by changing the value of at least one variable coupling element disposed within the flip-flop circuit configuration.

Now essential prerequisites for realizing these objectives of the invention are satisfied according to the invention in that a known controllable bistable flip-flop circuit arrangement of the general character heretofore described has each amplifier provided between its output and its input with a respective additional alternating current-feedback path containing phase-rotating impedances. By means of the non-galvanic action of a movable control body the value of at least one of the phase-rotating impedances can be changed in such a manner that for the one or the other of both amplifiers a positive alternating current-feedback condition is selectively fulfilled between its output and its input, which renders unstable the operating state or condition in which the relevant amplifier is functioning in a differentially amplifying manner and by means of the direct current-coupling path common to both amplifiers, switches such amplifier into the other operating state or condition.

Hence, with a flip-flop circuit arrangement designed according to the teachings of the invention, it is possible to render unstable the operating state in which the relevant amplifier element is active, that is, works in a differentially amplifying manner, by fulfilling the positive feedback condition, i.e., the self-oscillating condition, in that there is appropriately influenced at least one phase-rotating impedance in a least one of both alternating-current feedback loops having associated therewith one of the respective amplifying elements. Under the action of the immediately arising current fluctuations at the relevant active amplifier and through the action of the direct current-coupling path common to both amplifying elements, the other amplifying element is driven or switched into its active, differentially amplifying operational state or condition. Consequently, by means of the same direct-current coupling path, the previously amplifying first amplifier is switched into its inactive operating condition and is locked in such inactive state or condition for such length of time until, for instance, by fulfilling the positive feedback condition for the second amplifier and by no longer fulfilling this positive feedback condition for the first amplifier, the switching or changeover into the first operating condition is brought about. The current fluctuations which are previously triggered at the alternating current-feedback circuit of the first amplifier are again immediately eliminated by the second amplifier by switching the relevant amplifier into the inactive operating condition, generally already after the first half-wave of the occurring oscillation.

The contactless change of a phase-rotating impedance from externally by means of mechanically moving a control body does not represent any great problem in that it is known for instance to change the capacitance between two foils or films of an open capacitor by approaching or removing a conductive plate functioning as a capacitive bridge, or to change the inductance of a coil or the mutual inductance of two coils similarly by contactless approach or removal of a suitable control body, for instance a ferromagnetic body or a body formed of conductive material.

For the purpose of reducing the circuit expenditure but while still realizing the objectives of this invention, it would be possible to have components of both alternating current-feedback paths simultaneously provide components of direct currentcoupling path common to both amplifiers. Additionally, phase-rotating impedances which are inherent to both amplifiers, for instance the base-collector capacitance of a transistor which markedly alters as a function of the momentary operating state, can form the effective or active impedances of the corresponding alternating current-feedback circuit.

A flip-flop circuit arrangement constructed in accordance with the teachings of the invention can form a mechanically controllable circuit arrangement which cooperates with at least one movable control body. The mechanically movable control body when assuming one of its positions can fulfill the positive feedback condition by contactless influence of one of the phase-rotating impedances of one of the alternating current-feedback paths and in its other position does not fulfill such condition, or the movable control body in one of its positions can fulfill the positive feedback condition in one of the alternating current-feedback paths or loops and in the other position fulfills the positive feedback condition at the other alternating current-feedback path.

Furthermore, a number of control bodies during the movement of a common support or carrier as a predetermined function of the momentary position of the carrier, can act upon a number of identical flip-flop circuit arrangements, as such is the case for instance with coded switches.

BRIEF DESCRIPTION OF THE DRAWINGS

The invention will be better understood and objects other than those set forth above, will become apparent when consideration is given to the following detailed description thereof. Such description makes reference to the annexed drawings wherein.

DETAILED DESCRIPTION OF THE PREFERRED EMBODIMENTS

Figure 1:
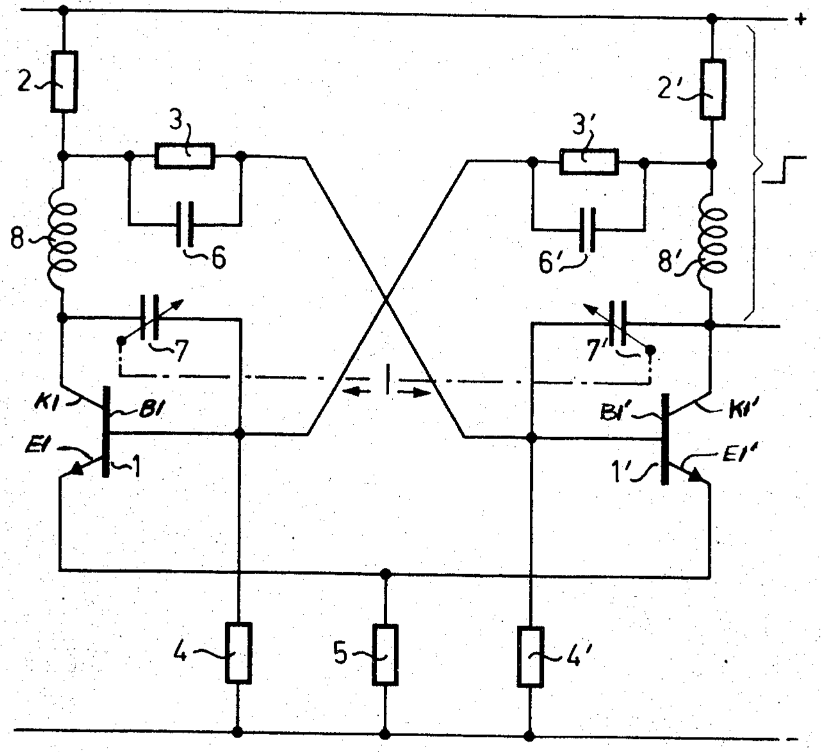
FIG. 1 is a schematic circuit diagram of a controllable, bistable flip-flop circuit arrangement incorporating two transistors as the amplifiers or amplifying elements, which apart from the common direct-current coupling path have associated therewith a respective special alternating current-feedback loop or path with a respective capacitor which can be varied from externally.

Referring now to the drawings in all of the exemplary embodiments of bistable flip-flop circuit arrangements as depicted herein, particularly as shown in FIGS. 1, 3, 5 and 6, such basically relate to known symmetrical flip-flop circuit configurations to the extent there is only considered the amplifiers and directcurrent effective components as well as the shunt capacitors 6 and 6' for the resistors 3 and 3' respectively.

Suitable amplifying elements or amplifiers for all of the illustrated exemplary embodiments of bistable flip-flop circuit arrangements are simple npn-transistors 1 and 1', for instance commercially available Philips-type BSY 38 transistors. The collector electrodes K1 and K1' of the respective amplifiers 1 and 1' and forming the amplifier outputs thereof are each connected through the agency of a respective resistor 2 and 2', for instance each 1,000 ohms, with the positive pole (+) of a suitable direct-current power source, otherwise not more particularly shown. The base electrode B1' of the transistor 1' forming one amplifier input is coupled with the junction point of the resistors 3 and 4'. In similar fashion, the base electrode B1 of the other transistor 1 forming the other amplifier input is connected with the junction point of the resistors 3' and 4. The resistance values of the resistors 3 and 3' amount in each case to 18,000 ohms for instance. The value of the resistances of the resistors 4 and 4' amounts to, for instance, in each instance, 15,000 ohms. The resistors 3 and 3' are connected with that respective terminal of the relevant resistors 2 and 2' respectively, which is coupled with the collector K1 and K1' of the transistors 1 and 1', respectively, as shown. The resistors 4 and 4' are coupled with the negative pole (−) of the aforementioned direct-current power source. The respective emitter electrodes E1 and E1' of both transistors 1 and 1' are connected via a common coupling resistor 5, the value of which amounts to, for instance, 220 ohms, with the negative pole (−) of the DC-voltage source.

Under the influence of the direct-current coupling path common to both transistors 1 and 1', — which DC-coupling path is formed by the collector K1 (output) from transistor 1-resistor 3-base B1' (input) of transistor 1'-collector K1' (output) of transistor 1'-resistor 3'-base B1 (input) of transistor 1-collector K1 (output) of transistor 1, — each symmetrical operating state or condition of both amplifying elements 1 and 1' is rendered instable and is automatically switched into one of two stable operating conditions in that, always one and only one of the amplifiers 1 and 1' is driven into its active, i.e., differentially amplifying operating state, whereas in each case the other amplifier is driven into its inactive operating state, in other words for all of the illustrated exemplary embodiments into its blocking state and vice versa.

As already mentioned, in the illustrated exemplary embodiments, the direct current-coupling resistors 3 and 3' are capacitatively shunted by a respective capacitor 6 and 6'. In this way, it is possible in known manner together with the unavoidable inherent input capacitance of the subsequently connected transistor 1 and 1', to reduce the differential control signal work required for the positive switching of the flip-flop circuit configuration out of the prevailing stable operating condition into the other stable operating condition, because owing to the non-symmetrical charging of both capacitors 6 and 6' there is favorably influenced for each of both operating conditions of the flip-flop circuit the switching into the other operating condition while avoiding the maintenance of the prevailing operating condition. Consequently, there is also brought about that fault or disturbance pulses which mutually act upon both amplifying elements 1 and 1' tend to switch the flip-flop circuit arrangement into the other operating state or condition. However, in the following description of the inventive construction of flip-flop circuit arrangements, this effect will be avoided in a favorable sense.

Now, in accordance with the circuit arrangement of FIG. 1, switching of the illustrated flip-flop circuit configuration into one or both stable operating conditions is brought about externally without any galvanic influences, by mechanically bringing about a change of at least one capacitance value. For this purpose, further phase-rotating impedances are coupled into the flip-flop circuit configuration, namely, capacitors 7 and 7' and inductors or inductance coils 8 and 8' which owing to their cooperative action form an additional alternating current-feedback path or loop for the respective transistor driven into its active amplifying state or range, and namely when :

a. Transistor 1 is in an active state

Collector K1 (output) of the active transistor 1 - coil 8 - capacitor 6 across resistor 3 - capacitor 7' across the blocked transistor 1' - coil 8' - capacitor 6' across the resistor 3' - base electrode B1 (input) of the active transistor 1.

b. Transistor 1' is in an active state

Collector K1' (output) of the active transistor 1' - coil 8' - capacitor 6' across resistor 3' - capacitor 7 across blocked transistor 1 - coil 8 - capacitor 6 across resistor 3 - base B1' (input) of the active transistor 1'.

The above considered alternating current-feedback path or loop associated in each case with the transistor which is driven into its active amplifying state or range brings about a positively acting feedback between the output (collector) of the relevant transistor and its input (base) insofar as the following approximately applicable conditions are fulfilled by the capacitances $C_6$, $C_7$, $C'_6$, $C'_7$, of the capacitors 6, 7, 6', 7', respectively, and the inductances $L_8$, $L'_8$ of the inductance coils 8 and 8', respectively :

1. $100pF < C_6, C'_6 >> C_7, C'_7$: capacitive short-circuit of the resistors 3, 3';

2*a*. positive alternating current-feedback for amplifying transistor 1 : $C'_7 \cdot L'_8 > C_7 \cdot L_8$;

2*b*. positive alternating current-feedback for amplifying transistor 1' : $C_7 \cdot L_8 > C'_7 \cdot L'_8$.

A positive feedback in an alternating current-feedback path between the output K1 or K1' and its own input B1 and B1' of an amplifier 1 and 1' respectively, causes the return of a small alternating current component or current fluctuation appearing at the output of the amplifier to the amplifier input in a phase position which, by means of the amplifier, is again brought at its output into the phase position of the original fluctuation and amplified. This means that the relevant amplifier provided that it and as long as it is driven into its active differentially amplifying operating state or range, together with its positive alternating current-feedback path, is unstable, i.e., at least momentarily forms a self-oscillating oscillator. This effect is utilized in the flip-flop circuit arrangement of FIG. 1 in the manner that, by alternately mutually changing the capacitance values $C_7$ and $C'_7$ of both capacitors 7 and 7' at one time the positive feedback condition 2*a* is fulfilled for the amplifying transistor 1 and another time there is fulfilled the positive feedback condition 2*b* for the amplifying transistor 1'.

In the event that the positive feedback condition 2*a*, i.e., $C'_7 \cdot L_8 > C_7 \cdot L_8$ is fulfilled, for instance $C'_7 > C_7$ with $L'_8 = L_8$, then the operating condition in which the transistor 1 is driven in its active, i.e., amplifying state is rendered instable in that there is inherently excited therein an oscillation through the agency of an alternating current-coupling loop. As soon as at least an appropriately directed or rectified half-wave of one such current fluctuation or oscillation of sufficiently great amplitude switches-over, via the resistor 3 and capacitor 6, the other transistor 1' from the prior blocking or cut-off state into the active amplifying state, then this new state or condition is maintained in that, in turn, now the active transistor 1' locks the transistor 1 into its blocking or cut-off state through the agency of the resistor 3' and the capacitor 6'. Accordingly, the fulfillment of the positive feedback condition 2*a* at the alternating current-feedback path of the transistor 1 which has triggered the previously mentioned conditional change becomes ineffectual, since now the transistor 1 is no longer operating in its amplifying state, rather works in its saturation range, i.e., has been driven to be inactive. On the other hand, for the now amplifying transistor 1' the positive feedback condition has not been fulfilled so that the newly attained operating state for the amplifying transistor 1' remains stable until carrying out a desired switching-back into the first operating state or condition. This switching-back can be realized in that the capacitance value $C'_7$ of the capacitor 7' is reduced and, if desired, there is simultaneously increased the capacitance value $C_7$ of the capacitor 7 until the positive feedback condition 2*b*, i.e., $C_7 > C'_7$ has been fulfilled for the now amplifying transistor 1'. When this has occurred a current fluctuation or oscillation takes place at the alternating current-feedback circuit via the amplifying transistor 1'. With sufficient amplitude, and through the agency of the resistor 3' and the capacitor 6' this immediately switches over the previously inactive transistor 1 into its active state. Hence, through the agency of the resistor 3 and the capacitor 6 the previously active transistor 1' is rendered inactive and the starting oscillation at such transistor 1' decays.

The phase-rotating impedances of the flip-flop circuit of FIG. 1 advantageously can possess the following values :

$$L_8 = L'_8 \approx 10^{-6}\ \text{H}$$

$$C_6 = C'_6 > 100\ \text{pF}$$

$C_7$ and $C'_7$, mutually variable in the range of 2 pF to 10 pF.

Figure 2:
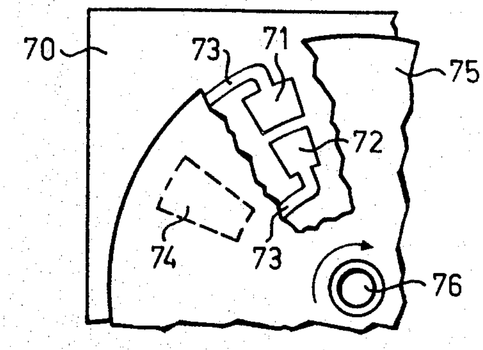
FIG. 2 is an exemplary fragmentary schematic illustration of a construction of variable capacitor which by approaching or withdrawing a removable conductive metallic plate can have its capacitance changed for the purpose of realizing the inventive objectives with the embodiment of circuitry depicted in FIG. 1.

It would be possible to use two trimmer capacitors as the variable capacitances $C_7$ and $C'_7$ which then can be mutually changed through the agency of a mechanically movable actuation control element. The now small capacitance changes of the capacitances $C_7$ and $C'_7$ can be, however, also brought about in a very simple manner in that, for instance, according to the showing of FIG. 2 the base electrode B1 or B1' and the collector electrodes K1 and K1' of one of the transistors 1 and/or 1' are electrically connected via leads or conductors 73 with a respective conductor plate 71 and 72. Both conductor plates 71 and 72 are situated adjacent to one another at a support or carrier plate 70 formed of insulating material and possess negligibly small capacitance, for instance, $C_7 \approx$ 1–2 pF. However, if another conductor plate, for instance, plate 74, which according to the arrangement of FIG. 2 is embedded in the likewise insulated support disc 75 rotatable about the axis 76, is brought close enough together to the conductor plates 71 and 72 in such a manner that this conductor plate 74 bridges or covers these conductor plates 71 and 72 with a small air gap, then the capacitance between the covered conductor plates becomes considerably greater, for instance $C_{7m} \approx$ 10 pF.

In a different position of the disc 75, which for instance can pivot back and forth, it is possible for its conductor plate 74 to cover or bridge corresponding conductor plates (not illustrated) connected as open capacitors at the transistor 1'. In this manner it is possible for the capacitor 7 to possess its greater value (10 pF) or its smaller value (1 – 2 pF) as a function of the momentary position of the mechanically movable conductor plate 74, whereas in each case the capacitor 7' would possess a smaller or larger value. Thus, as a function of the position of the movable disc 75, two different stable conditions would arise :

a. $C_{70} \approx$ 2 pF Transistor 1' active; transistor 1 blocking. $C'_{7m} \approx$ 10 pF b. $C_{7m} \approx$ 10 pF Transistor 1 active; transistor 1'blocking. $C'_{70} \approx$ 2 pF The internal base-collector capacitance $C_{BK}$ of transistors, with which there is effectively parallelly arranged each external capacitance $C_7$ and $C'_7$, automatically changes in a favorable manner as a function of its operating state or range. For instance, the following values are valid:

$$C_{BKs}\ \text{(Transistors blocking)} \approx 1 - 2\ \text{pF}$$

$$C_{BKa}\ \text{(Transistor active)} \approx 3 - 4\ \text{pF}$$

While taking into account this internal capacitance $C_{BKs}$ and $C_{BKa}$ the previously mentioned conditions for the stable conditions can be defined as follows:

| | |
|---|---|
| (a) $C_{70}+C_{BKs}$ 2–4 pF | Transistor 1' active |
| $C'_{7m}+C'_{BKa}$ 13–14 pF | Transistor 1 blocking or at cutoff |
| (b) $C_{7m}+C_{BKa}$ 13–14 pF | Transistor 1 active |
| $C'_{70}+C'_{BKs}$ 2–4 pF | Transistor 1' blocking or at cutoff |

Figure 3:
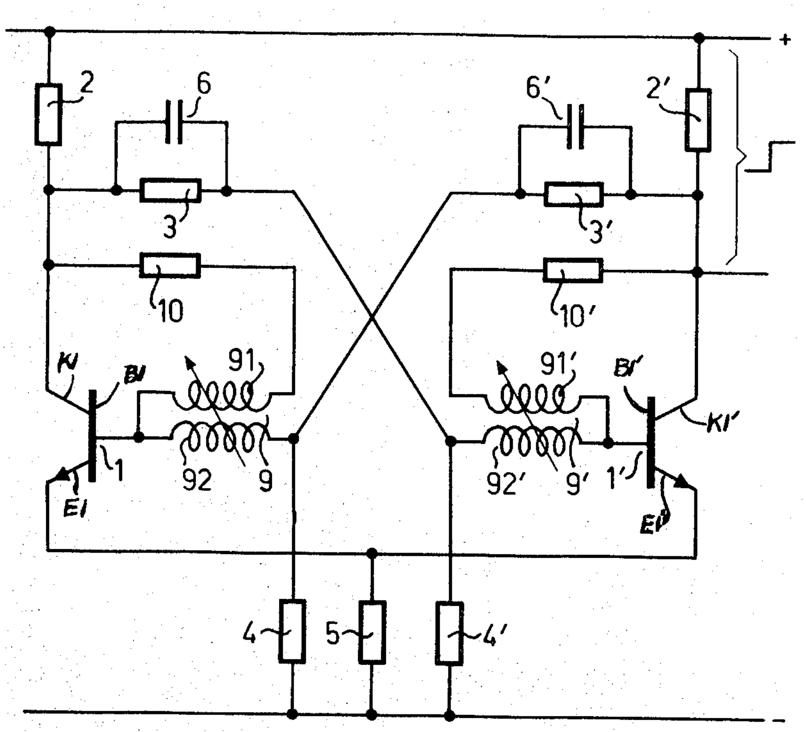
FIG. 3 is a further embodiment of inventive bistable flip-flop circuit arrangement in which both alternating current-feedback paths contain two respective coils of a transmission element in the oscillator circuit, the mutual inductance of which can be changed from externally.

Referring now to the flip-flop circuit configuration depicted in FIG. 3 it is to be recognized that the circuitry illustrated therein is constructionally similar in a great many respects to the circuit arrangement of FIG. 1 previously considered. Still, the flip-flop circuit arrangement illustrated in FIG. 3 differs from that depicted in FIG. 1 as well as the circuitry of FIGS. 5 and 6 to be discussed hereinafter, in that each of the transistors 1 and 1' has associated therewith variable mutual-inductances or transmission means 9 and 9', each incorporating two windings or inductance coils 91, 92 and 91', 92' respectively. One end of each pair of windings 91, 92 and 91', 92 is commonly connected to the base B1 and B1', respectively, of the associated transistor 1 and 1'. The opposite end of each winding 91 and 91' is connected via a respective resistor 10 and 10' with the corresponding collector K1 and K1' respectively of the associated transistors 1 and 1'. Two parallely connected coupling circuits can be seen to exist between the output and the input of transistor 1, these coupling circuits including elements 10, 91, the base-collector path of transistor 1, as well as the elements 3, 6, 92', 91', 10', 3', 6', and 92. Further, each coil 92 and 92' is connected into the direct-current coupling path with the associated resistor 3' and 3 thereof as shown.

Figure 4:
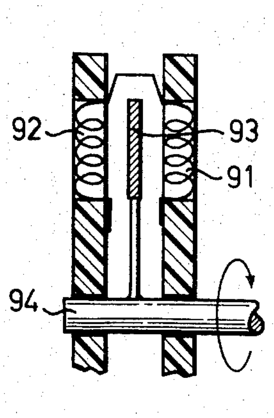
FIG. 4 is an exemplary embodiment of an arrangement of two transmission coils for changing their mutual inductance by approaching or removing a removable body in order to realize the objectives of the embodiment of circuitry of FIG. 3.

The component values of the coupling circuits within the bistable flip-flop configuration of FIG. 3 are dimensioned such that they commence to oscillate when transistor 1 conducts and when the mutual-inductance 9 has a predetermined value. The value of the mutual-inductance 9 can be changed without necessitating contact by means of a mechanically movable switching element as will be considered shortly hereinafter in conjunction with FIG. 4. In analogous manner two parallely connected coupling circuits likewise can be seen to exist for the transistor 1', which circuits, under certain conditions, also commence to oscillate. Now the switching of the flip-flop circuit configuration from one of the stable conditions into the other occurs as soon as the oscillation conditions have been fulfilled exactly in the manner as has already been described with respect to the bistable flip-flop circuit configuration of FIG. 1.

In the preferred inventive construction, the individual components of the circuit of FIG. 3 may have the following exemplary values:

| | |
|---|---|
| Resistors 2 and 2' | 1 kΩ |
| Resistors 3 and 3' | 8 kΩ |
| Resistors 10 and 10' | 220 kΩ |
| Resistors 4 and 4' | 15 kΩ |
| Resistor 5 | 220 kΩ |
| Capacitors 6 and 6' | 220 pF |

The mutual inductances $L_{12}$ and $L'_{12}$ between both windings 91, 92 and 91' 92' of the mutual inductance or transmission means 9 and 9' respectively, when attaining a sufficiently high value, insure for the positive alternating current-feedback condition from the collector to the base of the associated transistor, i.e., the instability or self-oscillating condition for such transistor provided that it is operating in its active amplifying range. It can be extinguished according to FIG. 4 by introducing a metallic conductor plate 93 which is rotatable upon a shaft 94 between the coils 91 and 92 and the coils 91' 92' respectively of one or the other of the mutual inductances or transmission means 9 and 9'. When the positive feedback condition is fulfilled via the transmission means 9 for the one transistor and is not fulfilled for the other transistor 1', then the actively amplifying condition of the transistor 1' is unstable and vice versa. Thus, by adjusting the movable conductor plate 93 at the one or the other of the transmission means, the one or the other operating condition of the flip-flop circuit of FIG. 3 can be brought about, as such has been explained for the other embodiments.

Figure 5:
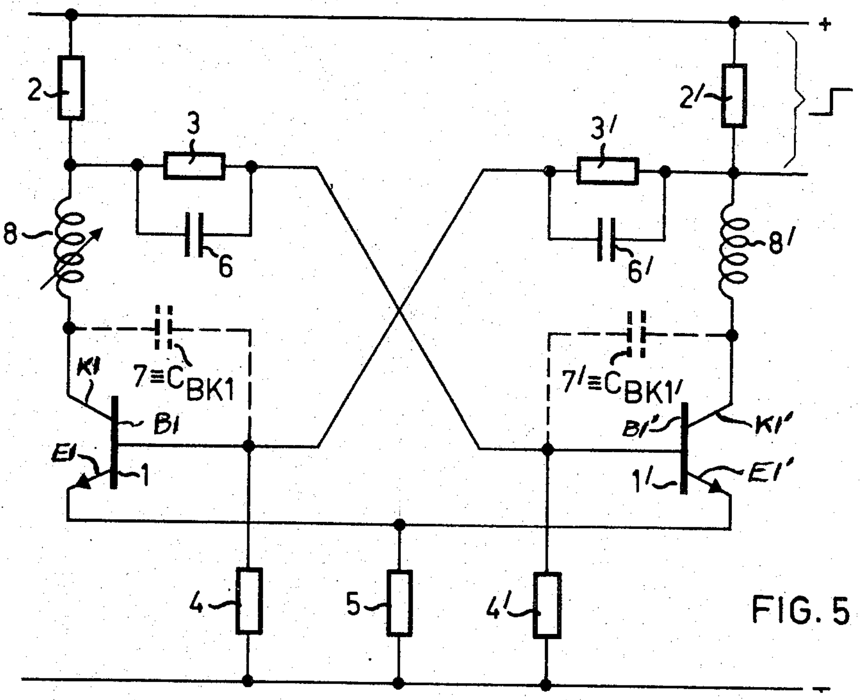
FIG. 5 is a circuit diagram of a bistable flip-flop circuit arrangement similar to the circuit configuration of FIG. 1, but employing a variable self-inductance.
Figure 6:
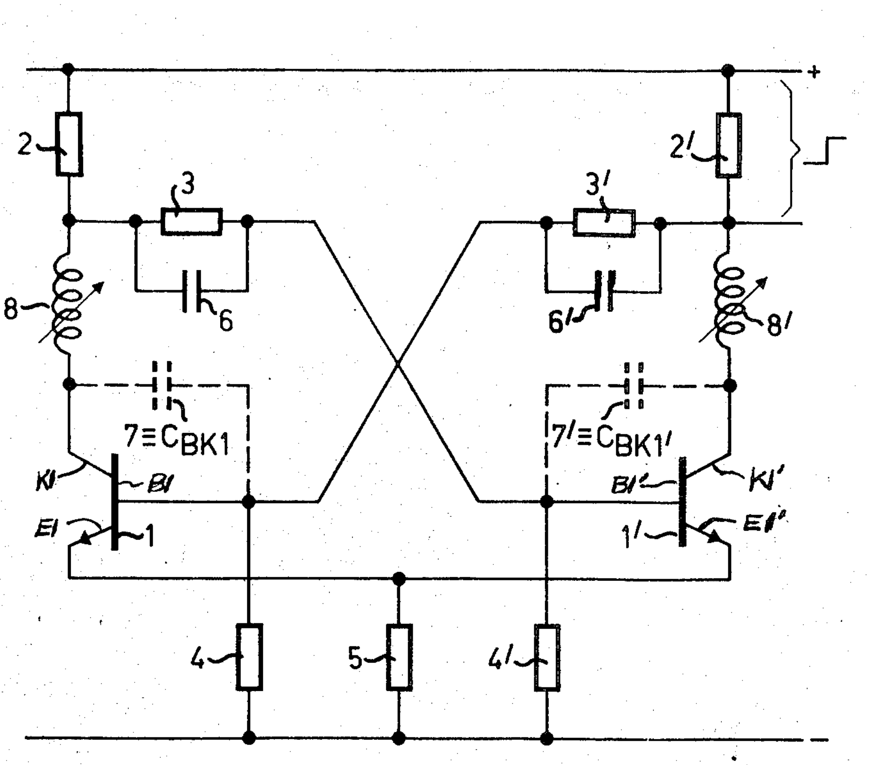
FIG. 6 schematically illustrates a variant construction of bistable flip-flop circuit arrangement of the instant invention utilizing two variable self-inductances.
Figure 7:
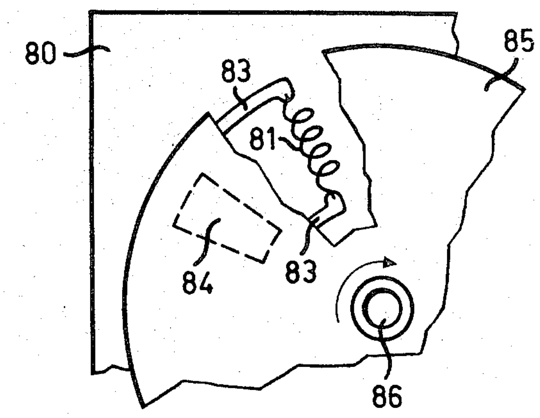
FIG. 7 illustrates a construction of variable self-inductance for carrying out the objectives with the circuit configurations of FIGS. 5 and 6.

Considering now the embodiments depicted in FIGS. 5 and 6 such do not provide any external capacitors 7 and 7' parallel to the respective internal base-collector capacitance $C_{BK}$ and $C'_{BK}$, yet however contemplate varying at least one of the coils 8 and 8' as a function of the momentary position of a movable control body of the type depicted in FIG. 7. Here, however, in contrast to FIG. 2, instead of using two conductor plates 71, 72 arranged adjacent to one another at a stationary support plate 70, there is provided a coil 81 which is located at a stationary support plate 80, the inductance of which can be considerably reduced by covering such by means of a conductor plate 84 provided at the movable disc or plate 85 (i.e., so-called eddy current effect). In the event that instead of the conductor plate 84 arranged at the movable disc or plate 85 there is used a control body formed of ferromagnetic material, for instance a ferrite rod, then in the overlapping position there is brought about an increase of the coil inductance.

Hence considering the embodiment of FIG. 5 more specifically an oscillating condition, i.e., a condition capable of oscillating, for the coupling circuits can be achieved by merely changing the value $L_8$ of the self-inductance 8 having a value of approximately 2 microhenries. Between the output and the input of each of the transistors 1 and 1' respectively only the base-collector capacitance appears, which as indicated above, being designated for the transistor 1 by $C_{BK_1}$ and for the transistor 1' by the value $C_{BK_{1'}}$. If desired, it would also be possible to provide an additional capacitor. The remaining coupling components in the circuit arrangement according to FIG. 5 possess values having an order of magnitude comparable to those already given with respect to the embodiments of circuitry depicted in FIGS. 1 and 3.

With respect to the circuit configuration of bistable flip-flop circuitry depicted in FIG. 6, such corresponds to that shown in FIG. 5 with the exception that, in addition, here there is also provided the inductance 8' which is variable. The component values are contemplated to be in the same order of magnitude as already described for the circuits depicted in FIGS. 1 and 3.

By changing at least one of the coil inductances $L_8$, $L'_8$ by means of the construction according to FIG. 8, there is provided the same possibilities for the contactless control of the operating conditions of one of the flip-flop circuits of FIGS. 5 and 6 as a function of the position of a mechanically movable control body, as already described in conjunction with FIG. 1, depending upon which of the following conditions are fulfilled:

Condition (a): Transistor 1 blocking, Transistor 1' active $L_8/L'_8 > C'_{BKa}/C_{BKs}$ : $L_8$ larger value and/or $L'_8$ smaller value Condition (b): Transistor 1 active, Transistor 1' blocking $L'_8/L_8 > C_{BKa}/C'_{BKs}$ : $L_8$ smaller value and/or $L'_8$ larger value It should be readily understood that there can be associated with a number of inventive flip-flop circuit arrangements a plurality of control bodies arranged at a common, for instance, rotatable or displaceable carrier or support plate, for the purpose of changing a phase-rotating impedance by approaching or removing one such movable control body with regard to the relevant impedance element. Therefore it is thus possible, similar to appropriate switching arrangements with movable switching contacts, to associate one of a number of discrete positions of the carrier plates with a predetermined conditional combination of all flip-flop arrangements. The movable switching means can be incorporated in a multi-positional selector switch having a mechanically actuatable switching wheel.

It is not only possible to use simple transistors for realizing the objectives of the invention, but also to use transistor combinations and integrated circuit amplifiers as the amplifier means, whereby under circumstances each integrated circuit amplifier need only have associated therewith a variable coupling capacitor as the alternating current-coupling loop.

The following favorable characteristics concerning insensitivity against disturbances, which for instance could act in the same manner at both amplifiers, is common at least for the embodiments depicted in FIGS. 1, 5, and 7. As soon as there has been fulfilled at one amplifier driven into its inactive differential amplifying operating range, by appropriately influencing at least one of the phase-rotating impedances of its associated alternating current-feedback path, the oscillating condition or instability condition then there occurs a switching into the other operating state or condition in which the amplifier element which was previously driven in its active operating range becomes inactive. For the other amplifier which is now driven in the active amplification range there is not, however, automatically fulfilled the positive feedback coupling condition or instability condition because there is fulfilled only one of these conditions, for instance $L'_8 \cdot C'_7 > L_8 \cdot C_8$ and not at the same time also the other condition $L'_8 \cdot C'_7 < L_8 \cdot C_7$ by one and the same momentary combination value of the phase-rotating impedances $L_8$, $L'_8$ $C_7$, $C'_7$.

Now if also the positive feedback or instability condition desired for the one amplifier, for instance the transistor 1, has been fulfilled, then, as long as the corresponding combination value of the phase-rotating impedance is not again desirably changed back, then the relevant flip-flop circuit arrangement can only remain in the one stable operating condition in which the amplifier, for instance the transistor 1', for which the positive feedback condition is not fulfilled, is driven in the active amplifying range. Each momentary disturbance which for itself could bring about a switching of the flip-flop circuit out of this one stable operating condition, leads to the instable operating state or condition, whereby immediately again the one stable operating condition is reached. Depending upon the momentary position of the movable control body for influencing the momentary combination value of the phase-rotating impedance, it is possible to positively bring about that the one or the other operating condition of the flip-flop circuit arrangement is realized.

The condition capable of oscillation in the coupling circuits of each of the configurations above-discussed can be considered as consisting of both an amplitude as well as a phase requirement, each of which requirements must be fulfilled. The amplitude condition or requirement, from a relative point of view, is less critical than the phase requirement and, in the preceding examples, the phase requirement was fulfilled by means of changing the value of the coupling components.

For the purpose of gaining a better understanding of the invention, an approximation of the phase requirement that must be fulfilled for each of the configurations of FIGS. 1, 5 and 6 are given hereinbelow.

PHASE CONDITIONS

Embodiment of FIG. 1

Both inductances 8 and 8' possess the values $L_8$ and $L_{8'}$ wherein $L_8 = L_{8'}$. The internal base-collector capacitances of the transistors 1 and 1' are $C_1$ and $C_{1'}$, respectively. Both of the variable capacitances 7 and 7' possess the values $C_7$ and $C_{7'}$. The phase requirement is fulfilled for conducting transistor 1, with blocking transistor 1', and simply expressed when the following conditions prevail:

$$C_{7'}/C_{1'} > C_7/C_1$$

Embodiment of FIG. 5

The fixed inductance 8' has the value $L_{8'}$. The variable inductance 8 has the value $L_8$. The capacitances 7 and 7' have the values $C_{BK1}$ and $C_{BK'}$. The phase requirement is fulfilled and expressed simply, for the transistor 1 conducting and with transistor 1' blocked, when:

$$L_8/L_{8'} > C_{BK1}/C_{BK1'}$$

Embodiment of FIG. 6

The variable inductances 8 and 8' have the values $L_8$ and $L_{8'}$. Both base collector capacitances 7 and 7' of the transistors 1 and 1' have the values $C_{BK1}$ and $C_{BK1'}$. Simply expressed, the phase requirement is fulfilled for the transistor 1 conducting with transistor 1' blocking when:

$$L_{8'}/L_8 > C_{BK1}/C_{BK1'}$$

While there is shown and described present preferred embodiments of the invention, it is to be distinctly understood that the invention is not limited thereto but may be otherwise variously embodied and practiced within the scope of the following claims. Accordingly,

What is claimed is:

1. A bistable flip-flop circuit arrangement comprising two amplifier elements each having an output and an input, one of which amplifier elements is conducting in each stable state of said flip-flop, coupling circuit means electrically connected with and disposed between the output and the input of each of said two amplifier elements, said coupling circuit means incorporating at least one coupling element having a variable value, said coupling circuit means forming a circuit capable of oscillating and including said conducting amplifier element and starting the generation of oscillations as soon as said at least one variable coupling element has attained a predetermined value within a given value range, the start of said oscillations switching the conductive condition of each said amplifier element to cause said oscillations to cease and said bistable flip-flop circuit arrangement to assume another stable state, a mechanically actuatable switching element means for effecting, in a contactless manner, change of the value of said at least one variable coupling element, said mechanically actuatable switching element means effecting a change in the value of said at least one variable coupling element by mechanically approaching and being removed from said at least one variable coupling element, and said at least one variable coupling element comprising a capacitor.

2. A bistable flip-flop circuit arrangement as defined in claim 1, wherein said capacitor comprises a single variable capacitor.

3. A bistable flip-flop circuit arrangement as defined in claim 1, including two variable capacitors.

4. A bistable flip-flop circuit arrangement comprising two amplifier elements each having an output and an input, one of which amplifier elements is conducting in each stable state of said flip-flop; coupling circuit means electrically connected with and disposed between the output and the input of each of said two amplifier elements, said coupling circuit means incorporating at least one coupling element having a variable value, said coupling circuit means forming a circuit capable of oscillating and including said conducting amplifier element and starting the generation of oscillations as soon as said at least one variable coupling element has attained a predetermined value within a given value range, the start of said oscillations switching the conductive condition of each said amplifier element to cause said oscillations to cease and said bistable flip-flop circuit arrangement to assume another stable state, a mechanically actuatable switching element means for effecting, in a contactless manner, change of the value of said at least one variable coupling element, said mechanically actuatable switching element means effecting a change in the value of said at least one variable coupling element by mechanically approaching and being removed from said at least one variable coupling element, and said at least one variable coupling element comprising a mutual-inductance.

5. A bistable flip-flop circuit arrangement as defined in claim 4, wherein said mutual-inductance comprises at least one variable mutual-inductance.

6. A bistable flip-flop circuit arrangement as defined in claim 4, wherein said mutual-inductance comprises two variable mutual-inductances.

7. A bistable and stability controllable flip-flop circuit arrangement, comprising two amplifiers each having an output and an input, means defining respective direct-current coupling paths for mutually coupling the respective output of each amplifier with the input of the other amplifier in such a manner that in each of both operating conditions one of both amplifiers assumes an active amplifying state and the other of both amplifiers is driven into an inactive non-amplifying state, means defining a respective alternating current-feedback path incorporating phase-rotating impedances arranged between both amplifiers between their own respective input and output, a movable control body for changing the value of at least one of the phase-rotating impedances such that selectively for the one or the other of both amplifiers a positive alternating current-feedback condition is fulfilled between its output and its input which renders unstable the amplifying state in which the relevant amplifier is functioning and via the direct current-coupling paths common to both amplifiers switches such amplifier into its other operating state, said movable control body comprising at least one mechanically movable control body capable of assuming different positions, said movable control body when in one of its positions, by contactless action upon one of the phase-rotating impedances of one of the alternating current-feedback paths, fulfilling a positive feedback condition and in another position thereof does not fulfill said feedback condition, and two adjacently arranged metallic plates which collectively form an open capacitor, said movable control body further comprising a conductor plate arranged at a support movable relative to metallic plates so that said conductor plate can be selectively moved into a position bridging said metallic plates and out of said bridging position to selectively alter the capacitance of said open capacitor.

8. A bistable and stability controllable flip-flop circuit arrangement, comprising two amplifiers each having an output and an input, means defining respective direct-current coupling paths for mutually coupling the respective output of each amplifier with the input of the other amplifier in such a manner that in each of both operating conditions one of both amplifiers assumes an active amplifying state and the other of both amplifiers is driven into an inactive non-amplifying state, means defining a respective alternating current-feedback path incorporating phase-rotating impedances arranged between both amplifiers between their own respective input and output, a movable control body for changing the value of at least one of the phase-rotating impedances such that selectively for the one or the other of both amplifiers a positive alternating current-feedback condition is fulfilled between its output and its input which renders unstable the amplifying state in which the relevant amplifier is functioning and via the direct current-coupling paths common to both amplifiers switches such amplifier into its other operating state, said movable control body comprising at least one mechanically movable control body capable of assuming different positions, said movable control body when in one of its positions, by contactless action upon one of the phase-rotating impedances of one of the alternating current-feedback paths, fulfilling a positive feedback condition and in another position thereof does not fulfill said feedback condition, each phase-rotating impedance comprising a pair of coils, said control body being arranged at a movable support disposed between two such coils for movement relative thereto for changing their mutual inductance, said control body being positionally adjustable between such coils and movable out of such effectual position into an ineffectual position.

9. The flip-flop circuit arrangement as defined in claim 8, wherein said control body comprises a metallic conductor plate.

10. A bistable and stability controllable flip-flop circuit arrangement, comprising two amplifiers each having an output and an input, means defining a respective direct-current coupling path for mutally coupling the respective output of each amplifier with the input of the other amplifier in such a manner that in each of both operating conditions of the circuit arrangement, one of both amplifiers assumes an active amplifying state and the other of both amplifiers is driven into an inactive non-amplifying state, means defining a respective alternating current-feedback path incorporating phase-rotating impedances arranged between both amplifiers between their own respective input and output, and means for mechanically changing the value of at least one of the phase-rotating impedances such that selectively for the one or the other of both amplifiers a positive alternating current-feedback condition is fulfilled between its output and its input which renders unstable the amplifying state in which the relevant amplifier is functioning and via the direct current-coupling paths automatically switches such amplifier into its other operating state and the other amplifier into its active amplifying state.

11. The flip-flop circuit arrangement as defined in claim 10, wherein both alternating current-feedback paths contain components which simultaneously form components of the direct current-coupling paths.

12. The flip-flop circuit arrangement as defined in claim 10 wherein both of the alternating current-feedback paths, each associated with one of both amplifier elements, each contain a respective mechanically variable impedance, a common mechanical actuation element associated with both said mechanically variable impedances such that upon mechanically adjusting said actuation element the values of the variable impedances are changed in opposed relationship to one another.

13. The flip-flop circuit arrangement as defined in claim 10, wherein said mechanically changing means comprises a movable control body.

14. The flip-flop circuit arrangement as defined in claim 13, wherein said movable control body comprises at least one mechanically movable control body capable of assuming different positions, said movable control body when in one of its positions, by contactless action upon one of the phase-rotating impedances of one of the alternating current-feedback paths, bringing about a self-oscillating condition in the associated alternating current-feedback path.

15. The flip-flop circuit arrangement as defined in claim 14, wherein said movable control body comprises a conductor plate which upon approach or withdrawal influences the value of one of said phase-rotating impedances so as to control the self-oscillating condition.

16. The flip-flop circuit arrangement as defined in claim 15, wherein said movable control body when in its one position fulfills the self-oscillating condition for one of the alternating current-feedback paths and in said another position fulfills the self-oscillating condition for the other alternating current-feedback path.

17. The flip-flop circuit arrangement as defined in claim 13, further including a plurality of control bodies secured to a common movable support, the movement of said support as a function of its momentary position influencing in a controlled manner a number of similar flip-flop circuit arrangements.

18. The flip-flop circuit arrangement as defined in claim 13, further including two adjacently arranged metallic plates which collectively form an open capacitor, said movable control body comprising a conductor plate arranged at a support movable relative to metallic plates so that said conductor plate can be selectively moved into a position bridging said metallic plates and out of said bridging position to selectively alter the capacitance of said open capacitor.

19. The flip-flop circuit arrangement as defined in claim 13, wherein each phase-rotating impedance comprises a pair of coils, said control body being arranged at a movable support disposed between two such coils for movement relative thereto for changing their mutual inductance, said control body being positionally adjustable between such coils and movable out of such effectual position into an ineffectual position.

20. The flip-flop circuit arrangement as defined in claim 19, wherein said control body comprises a metallic conductor plate.

21. The flip-flop circuit arrangement as defined in claim 13, wherein each phase-rotating impedance comprises a coil, said control body being secured to a support movable relative to said coil such that said control body can be moved out of an effectual position at the direct region of said coil into an ineffectual position remote from said coil.

22. The flip-flop circuit arrangement as defined in claim 21, wherein said control body comprises a metallic conductor plate.

* * * * *